United States Patent [19]

Nishida

[11] Patent Number: 5,410,279
[45] Date of Patent: Apr. 25, 1995

[54] BALANCED TYPE PHASE MODULATOR FOR USE IN MICROWAVE BAND

[75] Inventor: Masakazu Nishida, Tokyo, Japan

[73] Assignee: NEC Corporation, Tokyo, Japan

[21] Appl. No.: 237,674

[22] Filed: May 4, 1994

[30] Foreign Application Priority Data

May 7, 1993 [JP] Japan .................................. 5-106637

[51] Int. Cl.⁶ .............................................. H03C 3/04
[52] U.S. Cl. .................................... 332/146; 332/144
[58] Field of Search ................ 332/103, 104, 105, 144, 332/145, 146, 147, 148; 307/262, 321; 375/57, 60, 67; 455/110

[56] References Cited

U.S. PATENT DOCUMENTS 2,999,987  9/1961  Li ........................................ 332/105
3,566,088  2/1971  Crook .............................. 307/321 X
3,624,559 11/1971  Schaeperkoetter ............. 332/146 X

FOREIGN PATENT DOCUMENTS 60-136455  7/1985  Japan .

Primary Examiner—David Mis
Attorney, Agent, or Firm—Ostrolenk, Faber, Gerb & Soffen

[57] ABSTRACT

There is provided a phase modulator having a low signal loss characteristic and a simple circuitry configuration, comprising a phase modulating circuit and a linearizer connected thereto, wherein the phase modulating circuit includes a transformer to which high frequency signal is inputted, a first PIN diode connected to one of the terminals of the secondary coil of the transformer, a second PIN diode connected to the other terminal of the secondary coil with the reverse polarity to the first PIN diode, and a capacitor and a choke coil connected to the connecting point between the first and second PIN diodes, and the linearizer includes an operational amplifier whose output terminal is connected to the choke coil, a signal input terminal connected to the inverting input terminal of the operational amplifier, a feedback resistor connected to the output terminal of the operational amplifier, and two diodes connected, in parallel and with reverse polarity, between the feedback resistor and the inverting input terminal of the operational amplifier.

4 Claims, 2 Drawing Sheets

BALANCED TYPE PHASE MODULATOR FOR USE IN MICROWAVE BAND

BACKGROUND OF THE INVENTION

The present invention relates to a phase modulator and, more particularly, to a balanced type phase modulator for use in a microwave band.

A phase demodulator according to the prior art comprises, as illustrated in FIG. 4, a transformer 1 to which a local frequency or carrier frequency signal is inputted, a first Schottky barrier diode 13 connected to one terminal of the secondary coil (winding) of the transformer 1, a second Schottky barrier diode 14 connected to the other terminal of the secondary coil with the reverse polarity to the first Schottky barrier diode 13, and a capacitor 4 and a choke coil 5 connected in parallel to the connecting point between the first and second Schottky barrier diodes 13 and 14. In FIG. 4, a baseband signal is supplied through the coil 5, as a modulation signal.

In another phase modulator according to the prior art, as described in the Japanese Laid-open Patent Application No. 60(1985)-136455, the balance is adjusted by respectively applying bias voltages to two diodes.

However, the prior art phase modulator illustrated in FIG. 4 has a drawback of much signal loss, and, thus, has a problem that, for instance, the output level is low under predetermined intermodulation (IM).

On the other hand, in the phase modulator described in No. 60-136455, there is another problem of complex circuitry because it is necessary to supply the respective bias voltages to the two diodes.

SUMMARY OF THE INVENTION

It is an object of the present invention to provide a balanced type phase modulator having a characteristic of little signal loss.

It is another object of the present invention to provide a balanced type phase modulator having a simple circuit configuration, in which it is unnecessary to supply respective bias voltages.

According to the present invention, there is provided a balanced type phase modulator comprising a phase modulating which includes a transformer to which a high frequency signal is inputted, a first PIN diode connected to one terminal of the secondary coil of this transformer, a second PIN diode connected to the other terminal of the secondary coil with the reverse polarity to the first PIN diode, and a capacitor and a choke coil connected in parallel to the connecting point between these first and second PIN diodes, and a linearizer which includes an operational amplifier whose output terminal is connected to the choke coil and whose inverting terminal receives a baseband signal, a feedback resistor connected to the output terminal of the operational amplifier, and two diodes connected, in parallel and with reverse polarity, between the feedback resistor and the inverting input terminal of the operational amplifier.

Further, according to another aspect of the present invention, there is provided a phase modulator characterized in that the linearizer has an alternative circuitry configuration including an operational amplifier whose output terminal is connected to the choke coil and whose non-inverting input terminal receives a baseband input signal, and two diodes connected, in parallel and with the reverse polarity, between the output terminal and the inverting input terminal of the operational amplifier.

According to the present invention, signal loss can be prevented by applying the PIN diodes and the single circuit configuration can be provided by applying the linearizer including the diodes.

DESCRIPTION OF THE EMBODIMENTS

Figure 1:
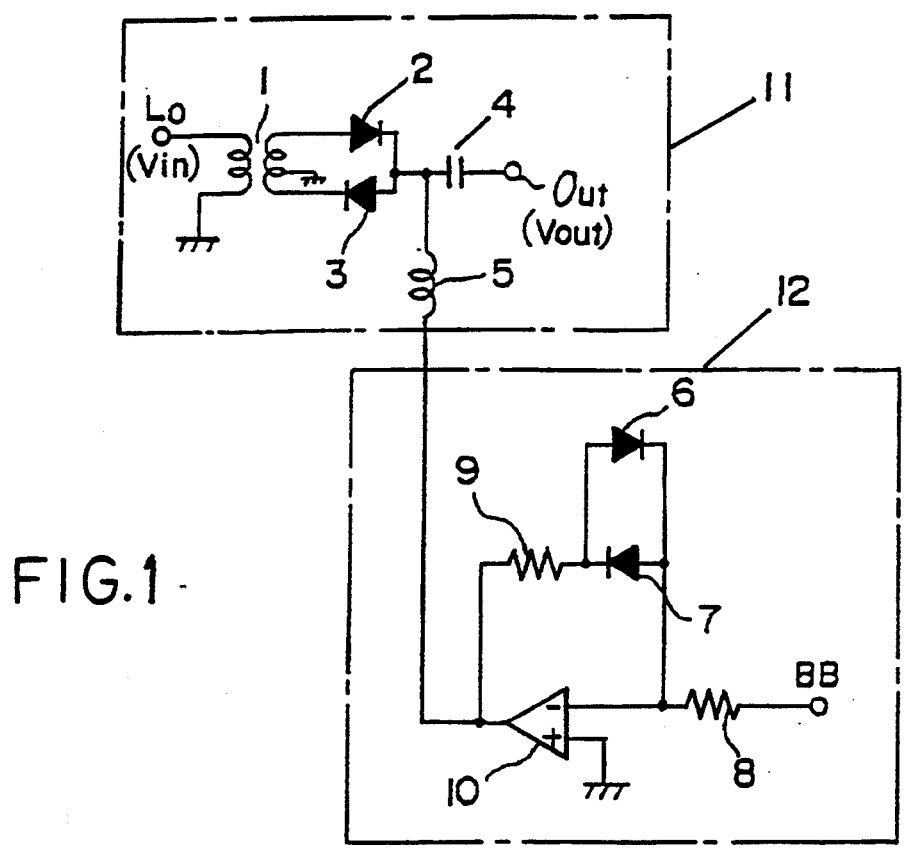
FIG. 1 shows a circuit diagram of a first embodiment of the present invention.

Referring to FIG. 1, a first embodiment of the invention comprises a phase modulating circuit 11 and a linearizer 12. The phase modulating circuit 11 includes a transformer 1 to which a high frequency signal is inputted, a first PIN diode 2 connected to one of the terminals of the secondary winding (coil) of the transformer 1, a second PIN diode 3 connected to the other terminal of the secondary coil with the reverse polarity to the first PIN diode 2, and a capacitor 4 and a choke coil 5 connected in parallel to the connecting point between the first and second PIN diodes 2 and 3. The linearizer 12 includes an operational amplifier 10 whose output terminal is connected to the choke coil 5 and whose inverting input terminal receives the signal from an input terminal BB via an input resistor 8, a feedback resistor 9 connected to the output terminal of the operational amplifier 10, and two diodes 6 and 7 connected in parallel with reverse polarity direction between the feedback resistor 9 and the inverting input terminal of the operational amplifier 10.

An RF signal or a local oscillation signal inputted to a primary input terminal $L_0$ of the transformer 1 undergoes phase inversion by the transformer 1, and enters the first and second PIN diodes 2 and 3. A baseband signal entering from the signal input terminal BB passes the linearizer 12, and is supplied to the phase modulating circuit 11. The signal from the first and second PIN diodes 2 and 3 and the signal from said linearizer 12 are multiplied and the resultant phase-modulated signal is outputted from an output terminal Out.

Figures 2A, 2B:
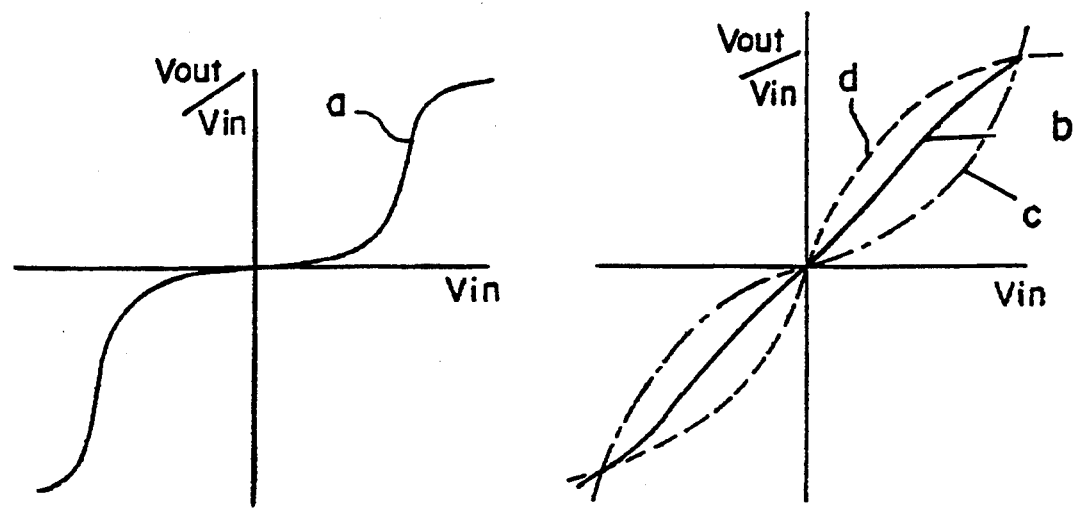
FIGS. 2(A) and 2(B) are diagrams for describing actions of the first embodiment of the invention.

Assuming that the baseband signal entering from the signal input terminal BB is supplied to the phase modulating circuit 11 without letting it pass the linearizer 12, the characteristic curve representing the relationship between the input voltage (Vin) at the input terminal $L_0$ and the ratio (Vout/Vin) of the output voltage (Vout) at the terminal Out and the input voltage (Vin) is given by a in FIG. 2(A) in accordance with characteristic of the PIN diodes. As shown in FIG. 2 (A), though the signal loss becomes small by using the PIN diodes, the characteristic curve itself becomes deteriorated. According to the present invention, the non-linear curve a shown in FIG. 2(A) is linearized by the linearizer 12.

In the linearizer 12, assuming that reverse-direction saturation current of the first and second PIN diodes 2 and 3 is represented by $I_{S1}$, and reverse-direction saturation current of the diodes 6 and 7 is represented by $I_{S2}$, resistance R of the feedback resistor 9 is set to be equal to $(I_{S2}/I_{S1}) \times 10$ (KΩ) and, thus, the characteristic curve representing the relationship between the input voltage (Vin) and the ratio (Vout/Vin) is given by b in FIG. 2 (B).

Further, if the resistance R is set to be greater than $(I_{S2}/I_{S1}) \times 10$ (KΩ), the characteristic curve representing the relationship between the input voltage (Vin) and the ratio (Vout/Vin) is given by c in FIG. 2 (B). Or, if R is set to be smaller than $(I_{S2}/I_{S1}) \times 10$ (KΩ), the characteristic curve representing the relationship between the input voltage (Vin) and the ratio (Vout/Vin) is given by d in FIG. 2(B).

Figure 3:
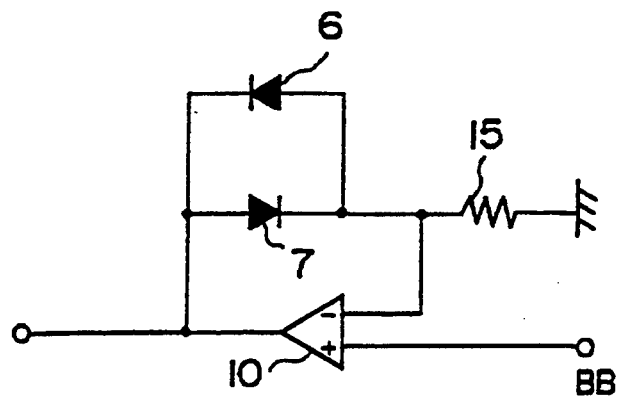
FIG. 3 shows a circuit diagram of a linearizer according to a second embodiment of the invention.
Figure 4:
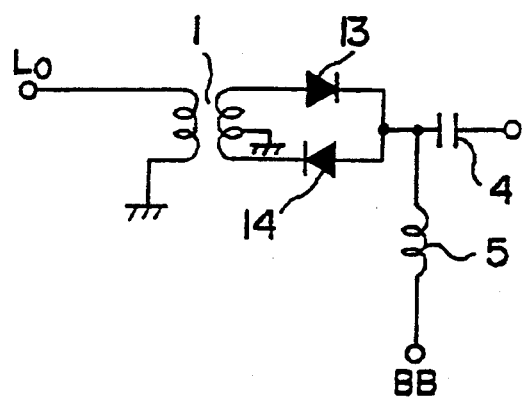
FIG. 4 shows a circuit diagram of one example of a phase modulator according to prior art.

FIG. 3 is a diagram illustrating an alternative circuitry configuration of the linearizer 12, according to a second embodiment of the present invention. In FIG. 3, the output terminal of an operational amplifier 10 is connected to the choke coil 5 and a signal input terminal BB is connected to the non-inverting input terminal of the operational amplifier 10. Further, two diodes 6 and 7 are connected in parallel with the reverse polarity between the output terminal and the inverting input terminal of the operational amplifier 10 and, between the inverting input terminal of the operational amplifier 10 and the grounding, a resistor 15 is connected. In this case, resistance of the resistor 15 is determined as the same as the resistance R of the resistor 9 in FIG. 1.

As described above, the phase modulator according to the present invention is advantageous in signal loss since the PIN diodes, which can provide a higher output level than Schottky barrier diodes, are used. Furthermore, by using the linearizer, the characteristic curve representing the relationship between the input and the output is improved and the simple circuitry configuration is obtained. In addition, the invention is preventive of harmful influence on the modulation operation in a high frequency range because PIN diodes have no rectifying activity.

What is claimed is:

1. A phase modulator comprising:

a transformer receiving a high frequency signal at a primary winding and having two output terminals at a secondary winding;

a first PIN diode connected to one output terminal of said secondary winding of said transformer;

a second PIN diode connected to the other terminal of said secondary winding of said transformer, said second PIN diode being arranged with the reverse polarity to said first PIN diode;

a coil connected to a connecting point between said first and second PIN diodes, and linearizing means receiving a baseband signal for delivering a linearized signal, wherein said linearized signal is supplied to said first and second PIN diodes through said coil.

2. A phase modulator as claimed in claim 1, wherein said linearizing means has two diodes connected in parallel with reverse polarity for linearizing a characteristic due to said first and second PIN diodes.

3. A phase modulator as claimed in claim 1, wherein said linearizing means includes;

an operational amplifier whose output terminal is connected to said coil, a signal input terminal connected to the inverting input terminal of said operational amplifier for receiving a baseband signal, a feedback resistor connected to the output terminal of said operational amplifier, and two diodes connected in parallel with reverse polarity between said feedback resistor and the inverting input terminal of said operational amplifier.

4. A phase modulator as claimed in claim 1, wherein said linearizing means includes, an operational amplifier whose output terminal is connected to said coil, a signal input terminal connected to the non-inverting input terminal of said operational amplifier for receiving baseband signal, and two diodes connected in parallel with reverse polarity between the output terminal and the inverting input terminal of said operational amplifier.

* * * * *